United States Patent
Jou

(10) Patent No.: US 10,439,004 B2
(45) Date of Patent: Oct. 8, 2019

(54) HIGH-EFFICIENCY OLED DEVICE

(71) Applicant: National Tsing Hua University, Hsinchu (TW)

(72) Inventor: Jwo-Huei Jou, Hsinchu (TW)

(73) Assignee: National Tsing Hua University (TW)

( * ) Notice: Subject to any disclaimer, the term of this patent is extended or adjusted under 35 U.S.C. 154(b) by 7 days.

(21) Appl. No.: 15/844,621

(22) Filed: Dec. 18, 2017

(65) Prior Publication Data
US 2019/0115397 A1 Apr. 18, 2019

(30) Foreign Application Priority Data
Oct. 18, 2017 (TW) .............................. 106135751 A

(51) Int. Cl.
*H01L 51/50* (2006.01)
*H01L 27/32* (2006.01)
*H01L 51/52* (2006.01)

(52) U.S. Cl.
CPC ...... *H01L 27/3209* (2013.01); *H01L 51/5012* (2013.01); *H01L 51/5056* (2013.01); *H01L 51/5072* (2013.01); *H01L 51/5206* (2013.01); *H01L 51/5221* (2013.01); *H01L 2251/552* (2013.01)

(58) Field of Classification Search
CPC ..... H01L 51/50; H01L 51/5056; H01L 51/00; H01L 51/52; H01L 51/006; H01L 51/5221; H01L 51/5206; H01L 51/0074; H01L 51/0052; H01L 51/0085; H01L 51/5016; H01L 51/5012; H01L 51/5004; H01L 51/5028
USPC .......................................................... 257/89
See application file for complete search history.

(56) References Cited

U.S. PATENT DOCUMENTS

2014/0299861 A1* 10/2014 Osaka ................. C07D 333/76
257/40
2018/0076390 A1* 3/2018 Ogita ..................... C09K 11/06

* cited by examiner

*Primary Examiner* — Chuong A Luu

(57) ABSTRACT

The present invention mainly discloses a high-efficiency OLED device, comprising: an anode substrate, a hole transport layer (HTL), at least one emission layer (EML), an electron transport layer (ELT), and a cathode layer. In this high-efficiency OLED, LUMO level of the HTL, LUMO level of the EML and LUMO level of the ETL together form a step-like LUMO level, and HOMO level of the HTL, HOMO level of the EML and HOMO level of the ETL also constitute one step-like HOMO level. On the other hand, the electron mobility of the ETL is greater than the EML's electron mobility by at least 2 orders in this high-efficiency OLED. Moreover, a variety of experimental data have proved that, a specific OLED would certainly exhibits outstanding luminance performance as long as the specific OLED is made based on the above-mentioned physical characteristics limitations for the ETL, the EML and the HTL.

14 Claims, 16 Drawing Sheets

HIGH-EFFICIENCY OLED DEVICE

BACKGROUND OF THE INVENTION

1. Field of the Invention

The present invention relates to the technology field of lighting devices, and more particularly to a high-efficiency OLED device.

2. Description of the Prior Art

It is known that organic light emitting diode (OLED) was initially invented and proposed by Eastman Kodak Company through a vacuum evaporation method. Tang and VanSlyke working for Kodak Company deposited an electron transport material (ETL) such as Alq3 on a transparent indium tin oxide (abbreviated as ITO) glass formed with an organic layer of aromatic diamine thereon, and subsequently completed the fabrication of an organic electroluminescent (EL) device after a metal electrode is vapor-deposited onto the ETL layer. Consequently, the organic EL device has become a new generation lighting device or display because of high brightness, fast response speed, light weight, compactness, true color, no difference in viewing angles, without using any LCD backlight plates, and low power consumption.

FIG. 1 shows an energy band diagram of a conventional OLED. Recently, some interlayers such as electron transport layer (ETL) and hole transport layer (HTL) are added into the structure of the organic EL device for forming an organic light-emitting device (OLED) with high current efficiency and power efficiency. For example, the organic light-emitting diode (OLED) 1' shown as FIG. 1 consists of a cathode 11', an electron transport layer (ETL) 13', an emission layer (EML) 14', a hole transport layer (HTL) 15', and an anode 18'. On the other hand, from the disclosures of U.S. patent publication No. 2009/0208776 A1, it is understood that the materials suitable for fabricating the ETL 13' certainly shows following physical characteristics: (1) having a lowest unoccupied molecular orbital level (LUMU level) lower than the EML's 14' LUMU level; and (2) having a highest occupied molecular orbital level (HOMO level) deeper than the EML's 14' HOMO level.

Furthermore, physical characteristics of the material suitable for fabricating the HTL 15' can be extrapolated by engineers skilled in development and manufacture of OLEDs based on the theories proposed by U.S. patent publication No. 2009/0208776 A1. The physical characteristics of the material suitable for fabricating the HTL 16' include: (1) having a HOMO level shallower than the EML's 14' HOMO level; and (2) having a LUMU level higher than the EML's 14' LUMU level.

Therefore, based on the disclosures and teaching from the related prior art documents, inventor of the present invention makes three OLED samples. FIG. 2A, FIG. 2B, and FIG. 2C show energy band diagrams of sample A, sample B and sample C, respectively. Moreover, information of constituting materials of the three OLED samples is integrated in following Table (1).

TABLE (1)

|  | Sample A | Sample B | Sample C |
| --- | --- | --- | --- |
| Anode 18' | ITO | ITO | ITO |
| HTL 15' | PEDOT:PSS | PEDOT:PSS | PEDOT:PSS |
| EML 14' | Spiro-2CBP | Spiro-CBP | CBP |
| ETL13' | TPBi | TPBi | TPBi |
| Cathode 11' | LiF/Al | LiF/Al | LiF/Al |

FIG. 3 shows a graphical plot of voltage versus luminance. From FIG. 3, it is found that OLED sample A has the best luminance performance, and the luminance exhibited by OLED sample C is the worst. It is worth noting that, the physical characteristics of the ETL 13' of OLED sample B does meet the theories proposed by U.S. patent publication No. 2009/0208776 A1; moreover, the HTL 15' of OLED sample B possesses the physical characteristics meeting the extrapolations made by the engineers skilled in development and manufacture of OLEDs. However, OLED sample B still does not exhibits the best luminance performance. On the contrary, despite the fact that the ETL 13' of OLED sample A possesses the physical characteristics meeting the theories proposed by U.S. patent publication No. 2009/0208776 A1 as well as the physical characteristics of the HTL 15' of OLED sample A does not meet the extrapolations made by the engineers skilled in development and manufacture of OLEDs, the OLED sample A still has the best luminance performance.

From above descriptions, it is understood that a specific OLED may not necessarily exhibits the best luminance performance even if the specific OLED is made based on the theories proposed by U.S. patent publication No. 2009/0208776 A1 and the extrapolations made by the experienced engineers. Therefore, how to fabricate an organic light-emitting device with high current efficiency and power efficiency through the use of those known knowledge and materials has become an important issue. In view of that, the inventor of the present application has made great efforts to make inventive research thereon and eventually provided a high-efficiency OLED device.

SUMMARY OF THE INVENTION

The primary objective of the present invention is to provide a high-efficiency OLED device, comprising: an anode substrate, a hole transport layer (HTL), at least one emission layer (EML), an electron transport layer (ELT), and a cathode layer. In this high-efficiency OLED, LUMO level of the HTL, LUMO level of the EML and LUMO level of the ETL together form a step-like LUMO level, and HOMO level of the HTL, HOMO level of the EML and HOMO level of the ETL also constitute one step-like HOMO level. On the other hand, the electron mobility of the ETL is greater than the EML's electron mobility by at least 2 orders in this high-efficiency OLED. Moreover, a variety of experimental data have proved that, a specific OLED would certainly exhibits outstanding luminance performance as long as the specific OLED is made based on the above-mentioned physical characteristics limitations for the ETL, the EML and the HTL.

In order to achieve the primary objective of the present invention, the inventor of the present invention provides an embodiment for the high-efficiency OLED device, comprising:

an anode substrate;
a hole transport layer (HTL), formed on the anode substrate;
a first emission layer (EML), formed on the HTL;

an electron transport layer (ETL), formed on the EML; and a cathode layer, formed on the ETL; wherein the HTL, the first EML and the ETL satisfy following conditions:

(1) a LUMO level of the first EML is lower than a LUMO level of the HTL, and a HOMO level of the first EML is deeper than a HOMO level of the HTL;
(2) a LUMO level of the ETL is lower than the LUMO level of the first EML, and a HOMO level of the ETL is deeper than the HOMO level of the first EML; and
(3) an electron mobility of the ETL is greater than an electron mobility of the first EML.

The embodiment of the high-efficiency OLED device, further comprises: a hole injection layer (HIL), formed between the anode substrate and the HTL; and an electron injection layer (EIL), formed between the HTL and the cathode layer.

The embodiment of the high-efficiency OLED device, further comprising a guest dye doped in the first EML.

The embodiment of the high-efficiency OLED device, further comprising at least one second emission layer (EML) formed between the first EML and the ETL or disposed between the first EML and the HTL.

The embodiment of the high-efficiency OLED device, further comprising an interfacial layer, which is formed between the ETL and the cathode layer, and used for enhancing a voltage drop across the ETL when the high-efficiency OLED device is applied with a bias voltage.

The embodiment of the high-efficiency OLED device, further comprising a carrier balance layer (CBL) formed between the first EML and the second EML.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a high-efficiency OLED device disclosed by the present invention, embodiments of the present invention will be described in detail with reference to the attached drawings hereinafter.

First Embodiment

Figure 1:
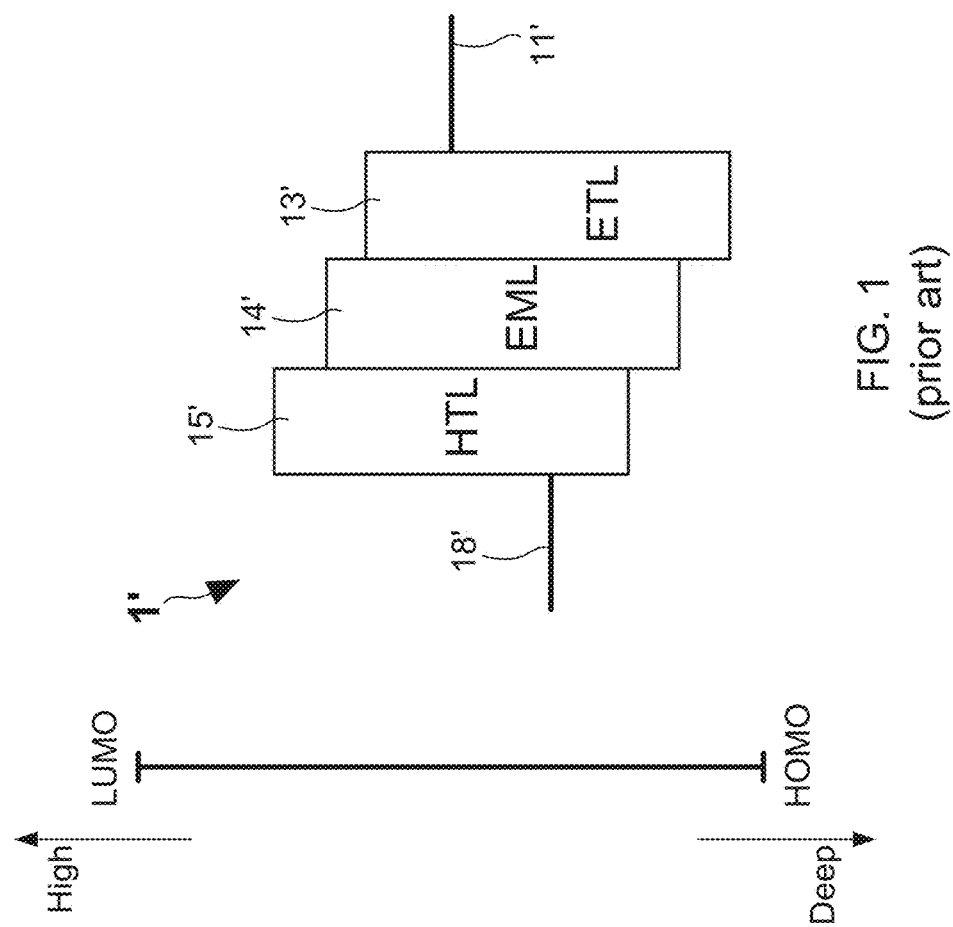
FIG. 1 shows an energy band diagram of a conventional OLED.
Figure 2A:
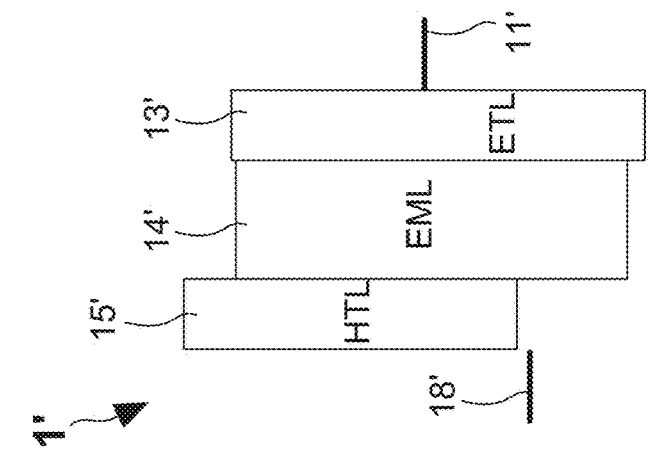
FIG. 2A shows an energy band diagram of sample A.
Figure 2B:
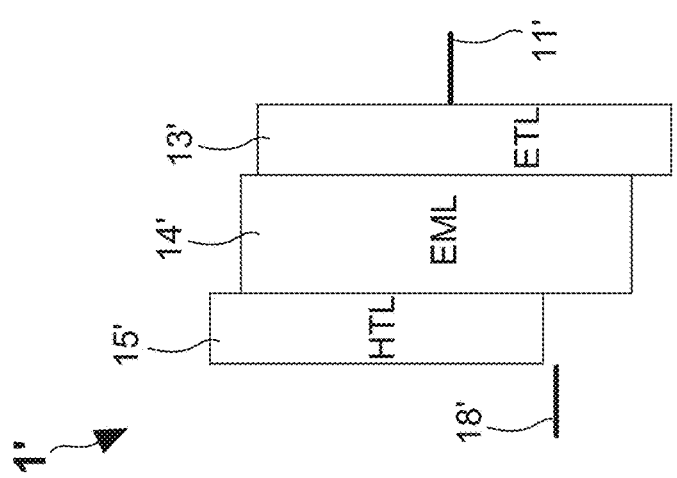
FIG. 2B shows an energy band diagram of sample B.
Figure 2C:
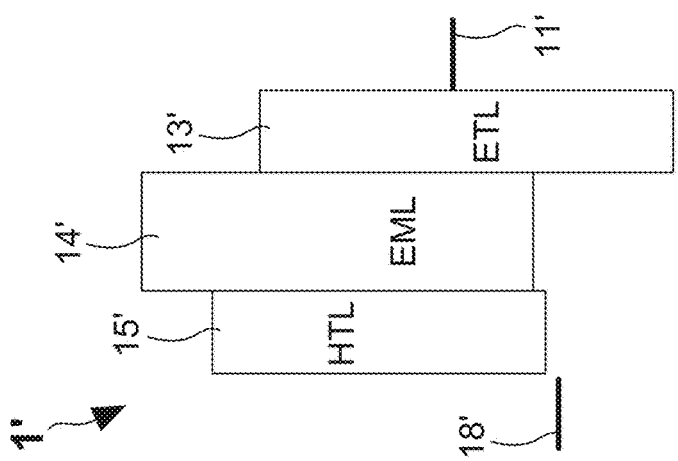
FIG. 2C shows an energy band diagram of sample C.
Figure 3:
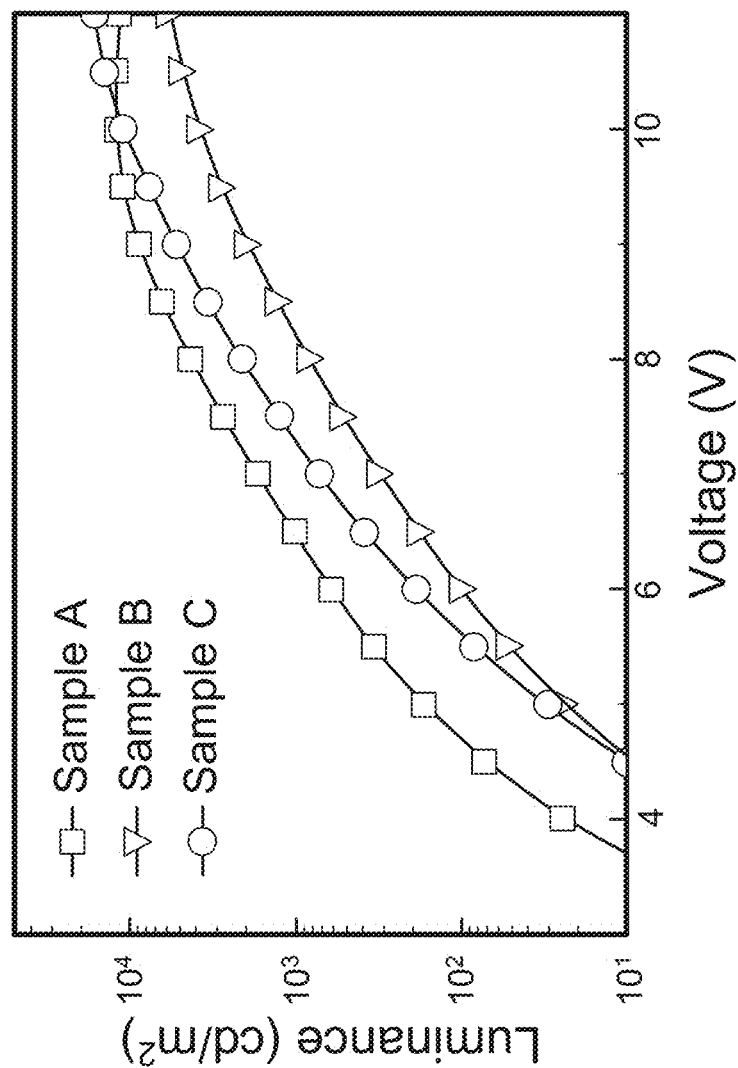
FIG. 3 shows a graphical plot of voltage versus luminance.
Figure 4:
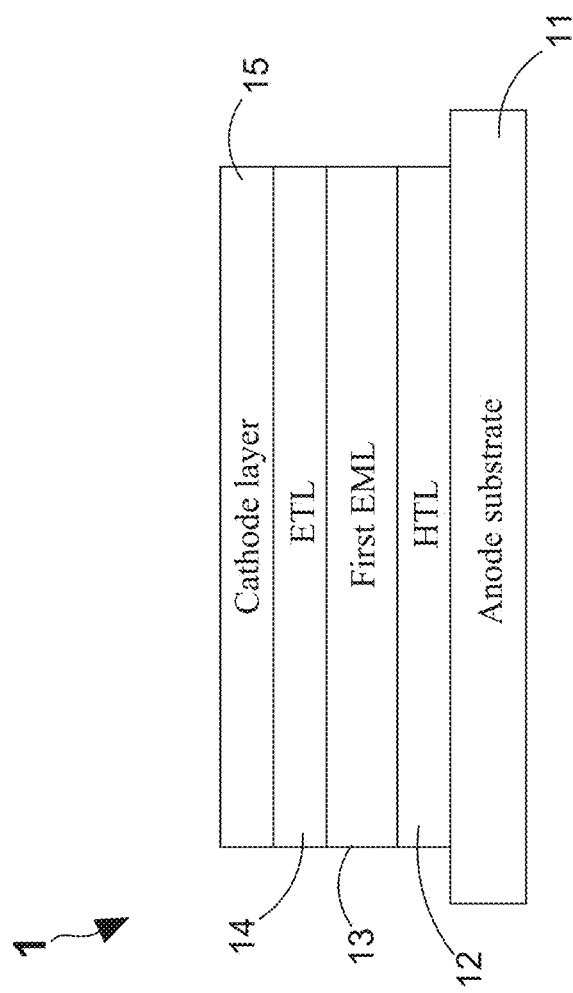
FIG. 4 shows a schematic cross-sectional diagram of a first embodiment of a high-efficiency OLED device according to the present invention.
Figure 5:
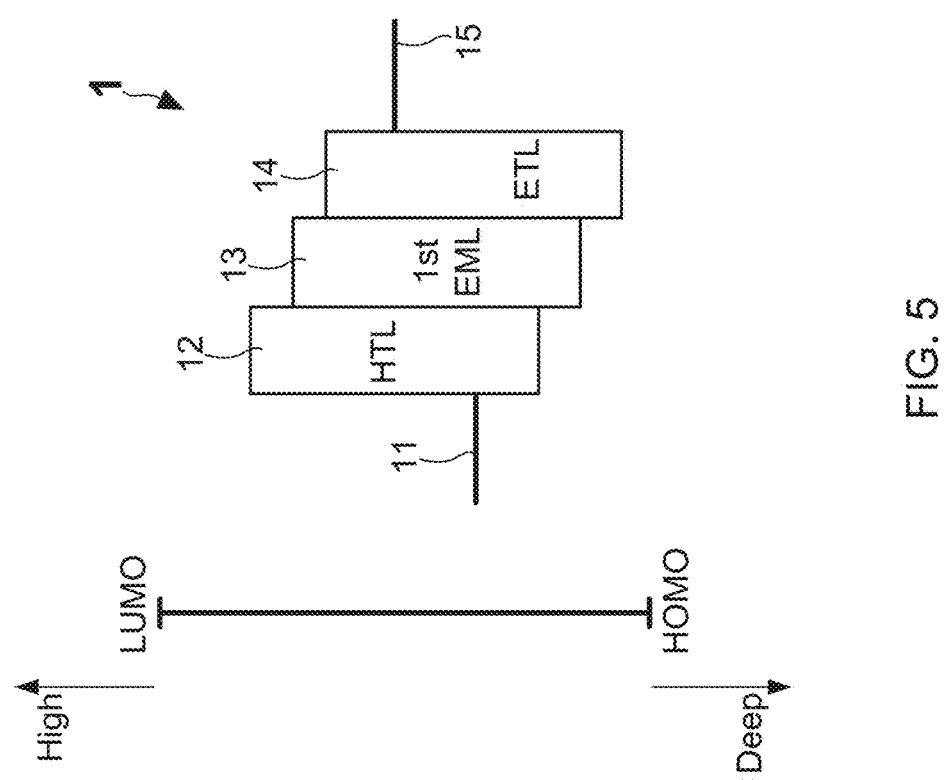
FIG. 5 shows an energy band diagram of the first embodiment of the high-efficiency OLED device.

With reference to FIG. 1, there is shown a schematic cross-sectional diagram of a first embodiment for this high-efficiency OLED device. Moreover, FIG. 5 shows an energy band diagram of the first embodiment of the high-efficiency OLED device. As FIG. 4 shows, the high-efficiency OLED device 1 of the present invention comprises: an anode substrate 11, a hole transport layer (HTL) 12 formed on the anode substrate 11, a first emission layer (EML) 13 formed on the HTL 12, an electron transport layer (ETL) 14 formed on the EML 12, and a cathode layer 15 formed on the ETL 14. It needs to emphasize that, the present invention particularly limits that the HTL 12, the first EML 13 and the ETL 14 must satisfy following conditions:

(1) a LUMO level of the first EML is lower than a LUMO level of the HTL, and a HOMO level of the first EML is deeper than a HOMO level of the HTL;
(2) a LUMO level of the ETL is lower than the LUMO level of the first EML, and a HOMO level of the ETL is deeper than the HOMO level of the first EML; and
(3) an electron mobility of the ETL is greater than an electron mobility of the first EML.

When the HTL 12, the first EML 13 and the ELT 14 satisfy the conditions (1) and (2), the LUMO level of the HTL 12, the LUMO level of the EML 13, and the LUMO level of the ETL 14 together form a step-like LUMO level; moreover, the HOMO level of the ETL 14, the HOMO level of the EML 13, and the HOMO level of the HTL 12 also constitute one step-like HOMO level. It is worth noting that, a specific OLED would certainly exhibits outstanding luminance performance as long as the specific OLED is fabricated based on the above-mentioned physical characteristics limitations for the HTL 12, the EML 13 and the ETL 14.

There are many HTL, EML and ETL materials capable of meeting the requirements of the above-mentioned physical characteristics limitations. For this reason, the present invention does not particularly limit the kinds or the types of the materials for making the HTL 12, the EML 13 and the ETL 14. Nevertheless, conventionally-used manufacturing materials for the HTL 12, the EML 13 and the ETL 14 are listed in following Table (2), Table (3) and Table (4). On the other hand, the anode substrate is a transparent conductive substrate such as ITO transparent conductive substrate, IZO transparent conductive substrate, and AgNWs (silver nano wires) transparent conductive substrate.

TABLE (2)

Manufacturing materials for HTL

| Synonym | Name |
| --- | --- |
| TAPC | 4,4'-cyclohexylidenebis[N,N-bis(4-methylphenyl)benzenamine] |
| NPB | N,N'-di(1-naphthyl)-N,N'-diphenyl-(1,1'-biphenyl)-4,4'-diamine |
| α-NPD | N,N'N,N'-bis(1-naphthyl)-N,N'N,N'-diphenyl-1,1'1,1'-biphenyl-4,4'4,4'-diamine |
| Spiro-NPB | N,N'-bis(naphthalen-1-yl)-N,N'-bis(phenyl)-9,9-spirobifluorene |

TABLE (3)

Manufacturing materials for HTL

| Synonym | Name |
| --- | --- |
| TPBi | 2,2',2"-(1,3,5-benzinetriyl)-tris(1-phenyl-1-H-benzimidazole) |
| B3PyPB | 1,3-bis(3,5-dipyrid-3-ylphenyl)benzene |
| TmPyPB | 1,3,5-Tri(m-pyridin-3-ylphenyl)benzene |
| TAZ | 3-(biphenyl-4-yl)-5-(4-tert-butylphenyl)-4-phenyl-4H-1,2,4-triazole |
| BPhen | 4,7-diphenyl-1,10-phenanthroline |
| Alq3 | Tris(8-hydroxyquinolinato)aluminum |

TABLE (4)

Manufacturing materials for first EML

| Synonym | Name |
| --- | --- |
| TCTA | Tris(4-carbazoyl-9-ylphenyl)amine |
| CBP | 4,4'-bis(N-carbazolyl)-1,1'-biphenyl |
| mCBP | 3,3-di(9H-carbazol-9-yl)biphenyl |
| Spiro-CBP | 2,2,7,7-tetrakiscarbazol-9-yl-9,9-spirobifluorene |
| Spiro-2CBP | 2,7-biscarbazo-9-yl-9,9-ditolyfluorene |
| CDBP | 4,4'-bis(9-carbazolyl)-2,2-dimethylbiphenyl |

For instance, after fabricating a specific OLED by using ITO substrate, TAPC, TCTA, TPBi, and LiF/Al complex as the anode substrate 11, the HTL 12, the first EML 13, the ETL 14, and the cathode layer 15, the specific OLED is the said high-efficiency OLED 1 and has an energy band structure as shown in FIG. 5.

First Experiment

Figure 6A:
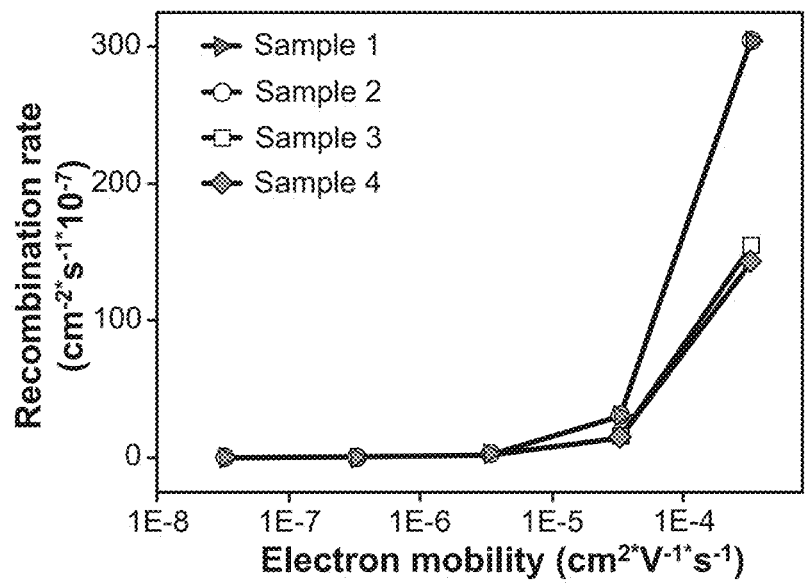
FIG. 6A shows a graphical plot of electron mobility versus recombination rate.
Figure 6B:
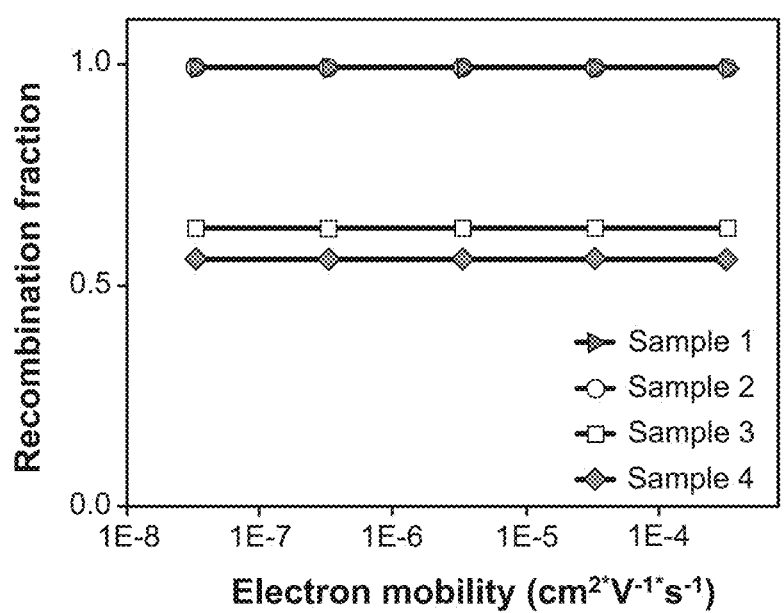
FIG. 6B shows a graphical plot of electron mobility versus recombination fraction.
Figure 7A:
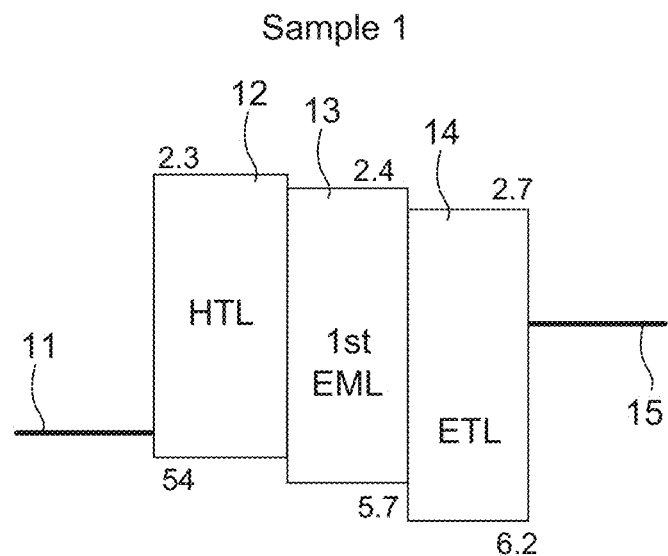
FIG. 7A shows an energy band diagram of sample 1.
Figure 7B:
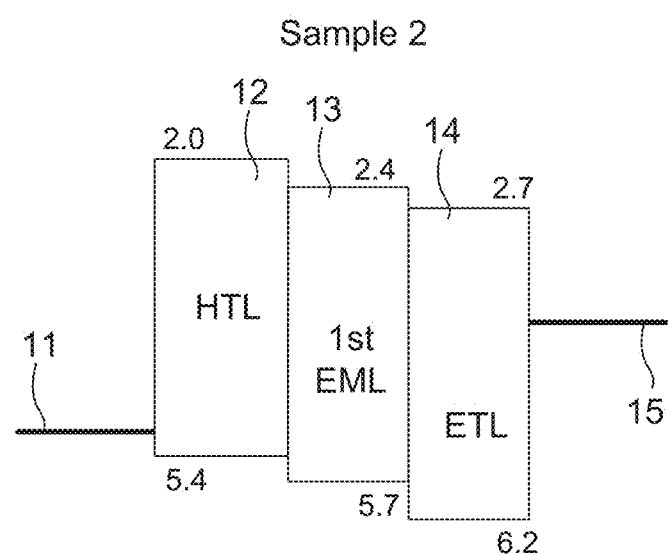
FIG. 7B shows an energy band diagram of sample 2.
Figure 7C:
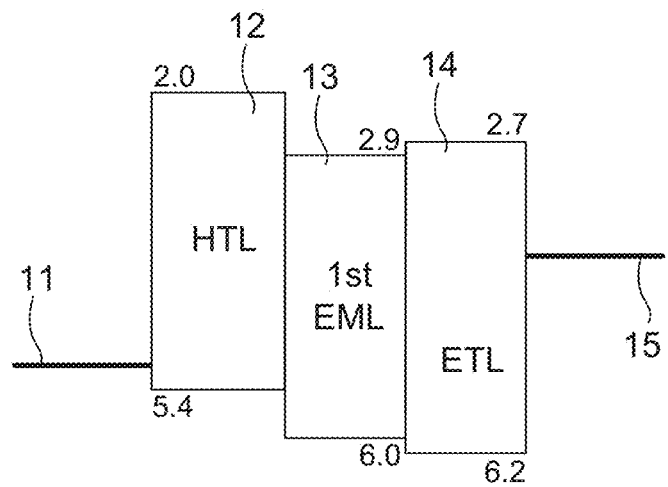
FIG. 7C shows an energy band diagram of sample 3.
Figure 7D:
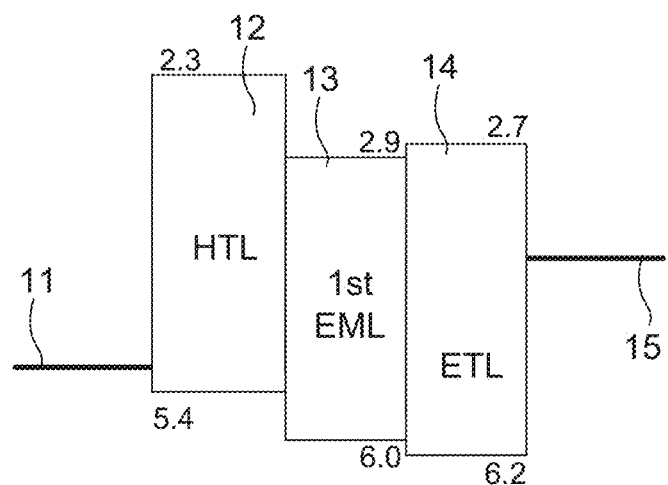
FIG. 7D shows an energy band diagram of sample 4.

For verifying whether a specific OLED would certainly exhibits outstanding luminance performance in the case of that its ETL, EML and HTL satisfy above-mentioned three conditions, the inventor of the present invention finished a first experiment through the use of a simulation software system. In the first experiment, variations of recombination rate and recombination fraction (also called recombination frequency) in the first EML are observed under changing the electron mobility of the ETL 14. FIG. 6A shows a graphical plot of electron mobility versus recombination rate, and FIG. 6B shows a graphical plot of electron mobility versus recombination fraction. Herein, it needs to explain that sample 1, sample 2, sample 3, and sample 4 are four OLED samples with different material constitutions. Information of constituting materials of the four OLED samples is integrated in following Table (5) and Table (6).

TABLE (5)

| Sample No. | Anode substrate | HTL | First EML | ETL | Cathode layer |
| --- | --- | --- | --- | --- | --- |
| 1 | ITO | α-NPD | TCTA | TPBi | LiF/Al |
| 2 | ITO | TAPC | TCTA | TPBi | LiF/Al |
| 3 | ITO | TAPC | CBP | TPBi | LiF/Al |
| 4 | ITO | α-NPD | CBP | TPBi | LiF/Al |

TABLE (6)

| | α-NPD | TAPC | TCTA | CBP | TPBi |
| --- | --- | --- | --- | --- | --- |
| Electron mobility ($\mu_e$, $cm^2/V*s$) | ~6 × $10^{-6}$ | ~$10^{-4}$ | ~3 × $10^{-6}$ | ~3 × $10^{-4}$ | ~3.3 × $10^{-5}$ |
| Hole mobility ($\mu_h$, $cm^2/V*s$) | ~6 × $10^{-5}$ | ~$10^{-2}$ | ~3 × $10^{-4}$ | ~2 × $10^{-3}$ | ~3.3 × $10^{-7}$ |

FIG. 7A, FIG. 7B, FIG. 7C, and FIG. 7D show energy band diagrams of sample A, sample B, sample C, and sample D, respectively. From FIG. 7A-FIG. 7D and FIG. 6A-FIG. 6B, it is found that the recombination fraction of electrons and holes in the first EML 13 would be greater than 0.6 when the HTL 12 and the first EML 13 satisfy the condition (1) or the first EML 13 and the ETL 14 satisfy the condition (2). Furthermore, the recombination fraction of electrons and holes in the first EML 13 would be greater than 0.9 when the HTL 12, the first EML 13 and the ETL 14 simultaneously satisfy the conditions (1) and (2). Moreover, it is also noted that, when the HTL 12, the first EML 13 and the ETL 14 simultaneously satisfy the conditions (1) and (2), the recombination rate of electrons and holes in the first EML 13 rises with the increasing of the electron mobility of the ETL 14 in the case of that the electron mobility of the HTL 12 and the electron mobility of the first EML 13 are both fixed. On the other hand, experimental data also indicate that the recombination rate of electrons and holes in the first EML 13 is increased by 6 times after the electron mobility of the of the ETL 14 is changed to be greater than the electron mobility of the first EML 13 by at least 2 orders.

Second Experiment

Figure 8A:
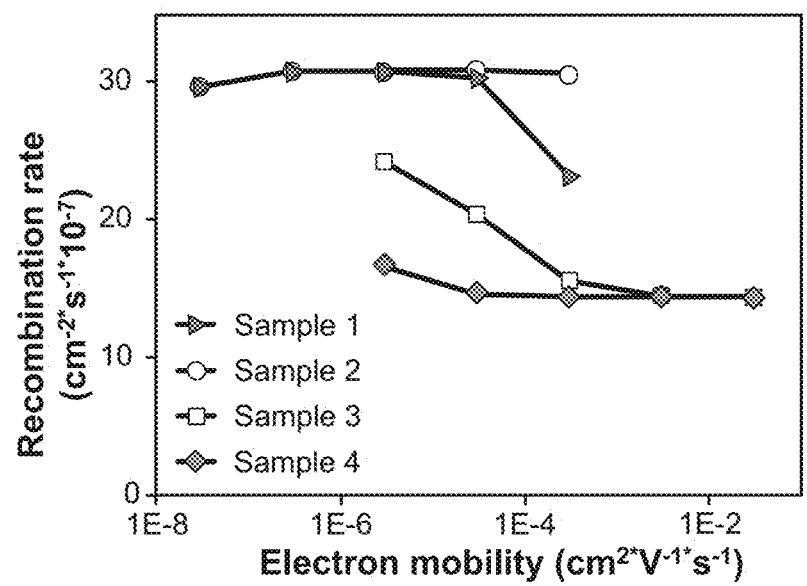
FIG. 8A shows a graphical plot of electron mobility versus recombination rate.
Figure 8B:
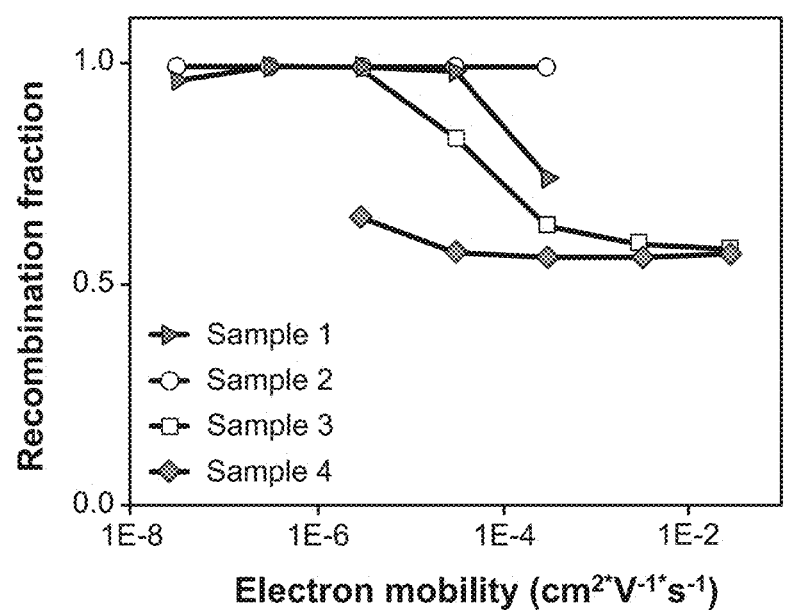
FIG. 8B shows a graphical plot of electron mobility versus recombination fraction.

Experimental data of the first experiment indicate that "when the HTL 12, the first EML 13 and the ETL 14 simultaneously satisfy the conditions (1) and (2), the recombination rate of electrons and holes in the first EML 13 rises with the increasing of the electron mobility of the ETL 14 in the case of that the electron mobility of the HTL 12 and the electron mobility of the first EML 13 are both fixed". In order to verify whether the finding of the first experiment is indeed a physical truth, the inventor of the present invention further completed a second experiment by using the simulation software system. In the second experiment, variations of recombination rate and recombination fraction in the first EML 13 are observed under changing the electron mobility of the first EML 13. FIG. 8A shows a graphical plot of electron mobility versus recombination rate, and FIG. 8B shows a graphical plot of electron mobility versus recombination fraction. Herein, it needs to explain that sample 1, sample 2, sample 3, and sample 4 are four OLED samples with different material constitutions. Information of constituting materials of the four OLED samples is integrated in above-presented Table (5) and Table (6).

From experimental data of sample 2, it is found that, when the HTL 12, the first EML 13 and the ETL 14 simultaneously satisfy the conditions (1) and (2), the recombination rate of electrons and holes in the first EML 13 would not rise with the increasing of the electron mobility of the first EML 13 in the case of that the electron mobility of the HTL 12 and the electron mobility of the ETL 14 are set to be constant. On the other hand, from the experimental data of samples 3 and 4, it is found that, when the HTL 12, the first EML 13 and the ETL 14 merely satisfy the condition (1), the recombination rate of electrons and holes in the first EML 13 would decline with the increasing of the electron mobility of the first EML 13 in the case of that the electron mobility of the HTL 12 and the electron mobility of the ETL 14 are set to be constant. Moreover, the recombination rate continuously decline until the electron mobility of the first EML 13 is changed to be greater than the electron mobility of the ETL 14 by at least 2 orders.

Figure 9A:
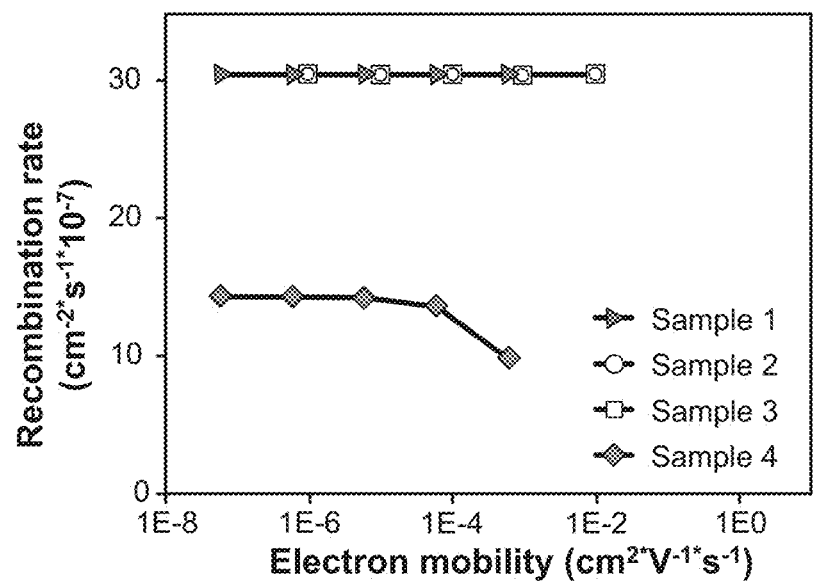
FIG. 9A shows a graphical plot of electron mobility versus recombination rate.
Figure 9B:
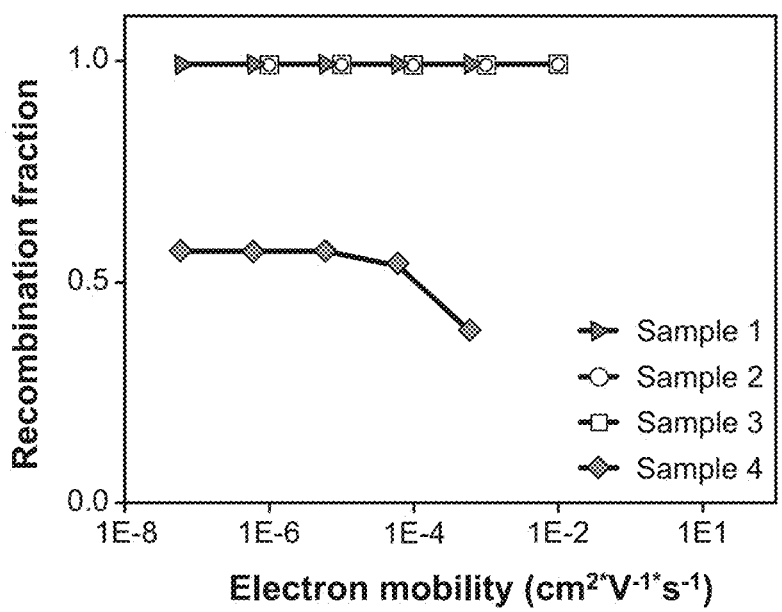
FIG. 9B shows a graphical plot of electron mobility versus recombination fraction.
Figure 10A:
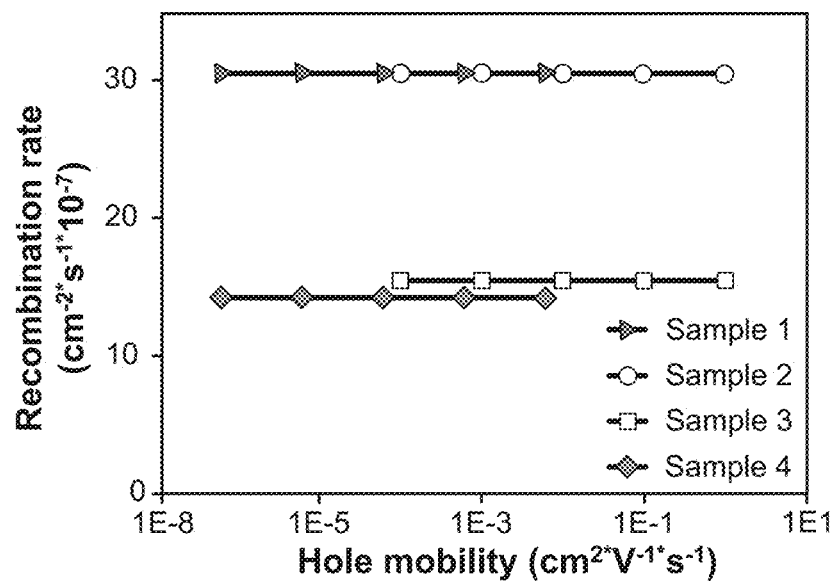
FIG. 10A shows a graphical plot of electron mobility versus recombination rate.
Figure 10B:
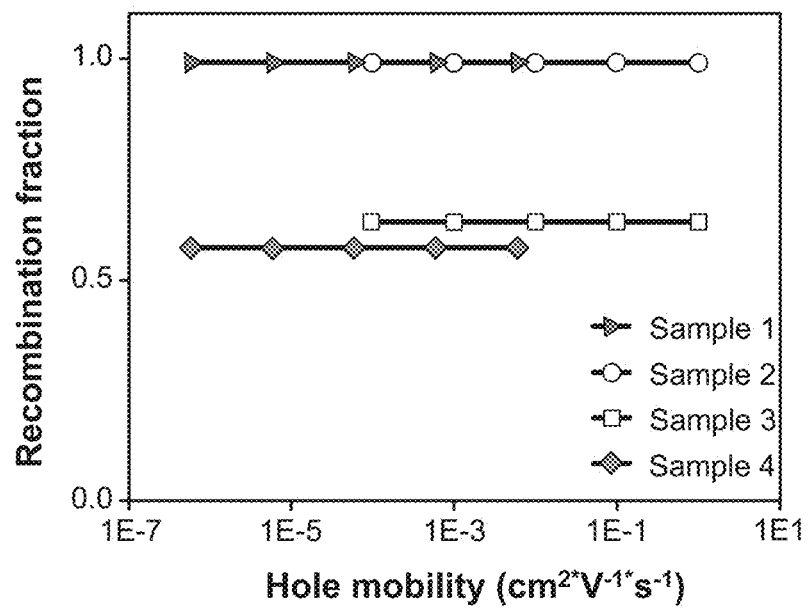
FIG. 10B shows a graphical plot of electron mobility versus recombination fraction.

FIG. 9A shows a graphical plot of electron mobility versus recombination rate, and FIG. 9B shows a graphical plot of electron mobility versus recombination fraction. From experimental data of FIG. 9A and FIG. 9B, it is understood that, the recombination rate of electrons and holes in the first EML 13 would not vary with the increasing of the electron mobility of the HTL 12 in the case of that the electron mobility of the ETL 14 and the electron mobility of the first EML 13 are both fixed. On the other hand, FIG. 10A shows a graphical plot of electron mobility versus recombination rate, and FIG. 10B shows a graphical plot of electron mobility versus recombination fraction. FIG. 10A and FIG. 10B indicate that, the recombination rate of electrons and holes in the first EML 13 would not vary with the increasing of the hole mobility of the HTL 12 in the case of that the electron mobility of the ETL 14 and the electron mobility of the first EML 13 are both fixed.

Therefore, experimental data have proved that: when the HTL 12, the first EML 13 and the ETL 14 simultaneously satisfy the conditions (1) and (2), the recombination rate of electrons and holes in the first EML 13 rises with the increasing of the electron mobility of the ETL 14 in the case of that the electron mobility of the HTL 12 and the electron mobility of the first EML 13 are both fixed.

Second Embodiment

It needs to further emphasize that, the present invention does also not particularly limit the constituting structure of the OLED. The present invention merely limit the high-efficiency OLED device must has a fundamental structure comprising: an anode substrate 11, a HTL 12, a first EML 13, a HTL 14, and a cathode layer 15, and simultaneously limit that the HTL 12, the first EML 13 and the ETL 14 must satisfy above-mentioned three physical characteristics limitations. In other words, it is able to expand other practicable embodiments for the high-efficiency OLED device 1 of the present invention by adding some functional layers into the fundamental structure of the high-efficiency OLED device 1, such as electron injection layer (EIL) and hole injection layer (HIL).

Figure 11:
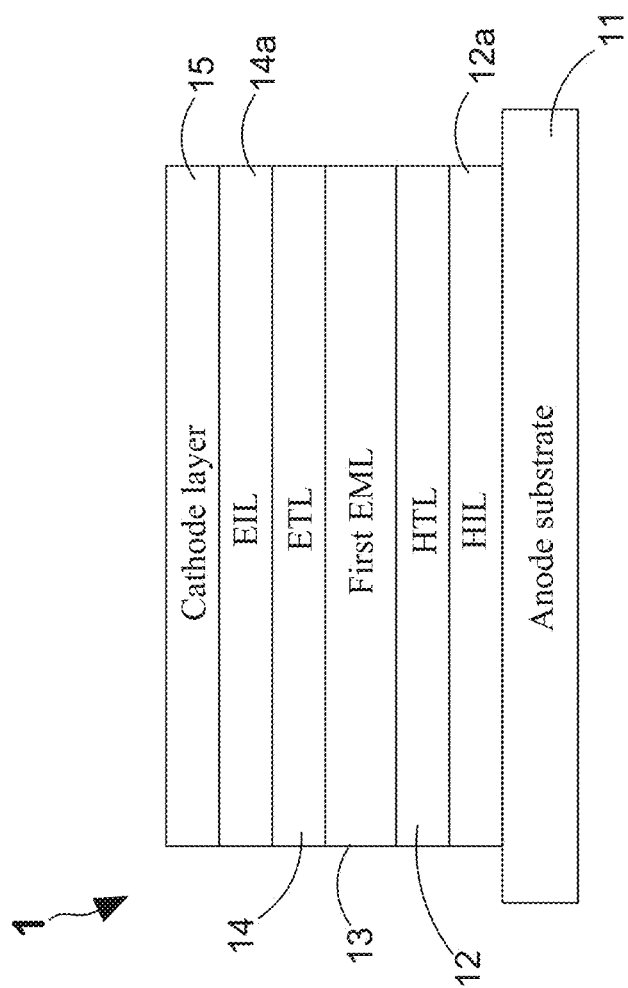
FIG. 11 shows a schematic cross-sectional diagram of a second embodiment of the high-efficiency OLED device.

FIG. 11 shows a schematic cross-sectional diagram of a second embodiment of the high-efficiency OLED device. After comparing FIG. 11 with FIG. 4, it is easy to know that the second embodiment of the high-efficiency OLED device 1 is obtained by adding a hole injection layer (HIL) 12a and an electron injection layer (EIL) 14a into the structure of the first embodiment. As FIG. 11 shows, the HIL 12a is formed between the anode substrate 11 and the HTL 12, and the EIL 14a is formed between the HTL 14 and the cathode layer 15. Moreover, conventionally-used manufacturing materials for the HIL 12a and the EIL 14a are listed in following Table (7) and Table (8).

TABLE (7)

| | Manufacturing materials for HIL |
|---|---|
| Synonym | Name |
| TPD | N,N'-diphenyl-N,N'-bis (3-methylphenyl)-1,1'-biphenyl-4,4'-diamine |
| 2-TNATA | 4,4',4''-Tris[2-naphthyl(phenyl)amino] triphenylamine |
| PEDOT:PSS | poly(3,4-ethylenedioxythiophene) polystyrene sulfonate |

TABLE (8)

| | Manufacturing materials for EIL |
|---|---|
| Synonym | Name |
| LiF | Lithium fluoride, often made to be a complex with Al for being used as the cathode layer 15. |
| $Li_2CO_3$ | Lithium carbonate |
| ZnO | Zinc oxide |
| o-MeO-DMBI | 2-(2-Methoxyphenyl-1,3-dimethyl-H-benzoimidazol-3-ium |

Third Embodiment and Fourth Embodiment

Figure 12:
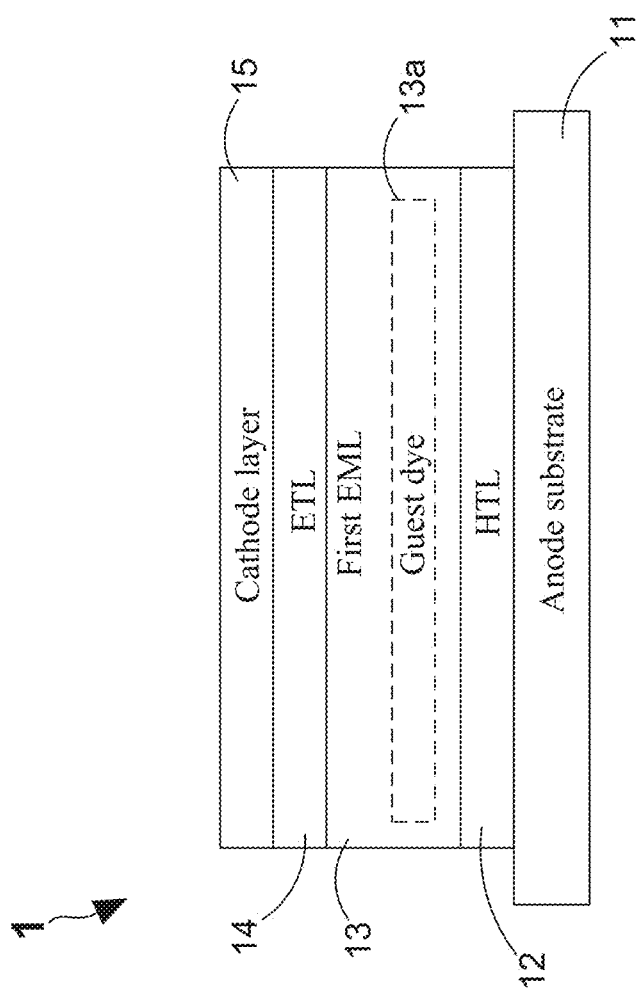
FIG. 12 shows a schematic cross-sectional diagram of a third embodiment of the high-efficiency OLED device.
Figure 13:
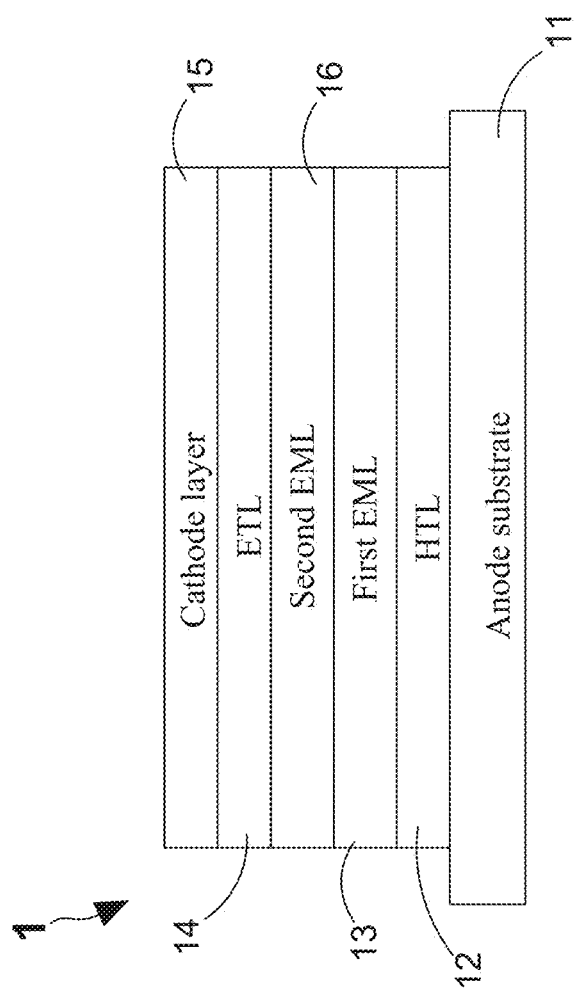
FIG. 13 shows a schematic cross-sectional diagram of a fourth embodiment of the high-efficiency OLED device.

FIG. 12 shows a schematic cross-sectional diagram of a third embodiment of the high-efficiency OLED device. After comparing FIG. 12 with FIG. 4, it is easy to know that the third embodiment of the high-efficiency OLED device 1 is obtained by adding a guest dye 13a into the structure of the first embodiment. As FIG. 12 shows, the guest dye 13a is doped in the first EML 13. On the other hand, FIG. 13 shows a schematic cross-sectional diagram of a fourth embodiment of the high-efficiency OLED device. As FIG. 13 shows, the fourth embodiment of the high-efficiency OLED device 1 further comprises a second emission layer (EML) 16 formed between the first EML 13 and the ETL 14. It is worth noting that the EML 16 can also be formed between the first EML 13 and the HTL 12.

Fifth Embodiment

Figure 14:
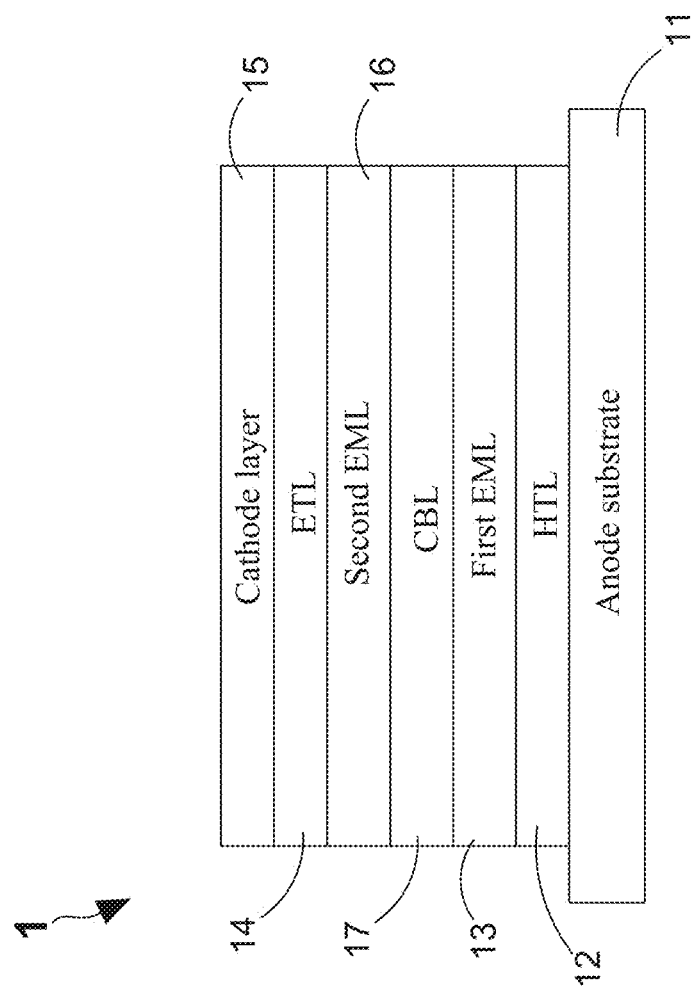
FIG. 14 shows a schematic cross-sectional diagram of a fifth embodiment of the high-efficiency OLED device.

FIG. 14 shows a schematic cross-sectional diagram of a fifth embodiment of the high-efficiency OLED device. After comparing FIG. 14 with FIG. 13, it is easy to know that the fifth embodiment of the high-efficiency OLED device 1 is obtained by adding a carrier balance layer (CBL) 17 into the structure of the fourth embodiment. As FIG. 14 shows, the CBL 17 is formed between the first EML 13 and the second EML 16. When fabricating the high-efficiency OLED device 1, the said CBL 17 can be a mixture of a portion of the first EML 13 and a portion of the second EML 16. Moreover, the CBL 17 can also be made of a specific material such as hole balance material, electron balance material and combination of the aforesaid two materials. Conventionally-used manufacturing materials for the CBL 17 are listed in following Table (9) and Table (10).

TABLE (9)

Hole balance materials for CBL

| Synonym | Name |
|---|---|
| MeO-TPD | N,N,N',N'-tetrakis(4-Methoxy-phenyl)benzidine |
| F4TCNQ | tetrafluoro-tetracyanoquinodimethane |
| (P3HT):F4TCNQ | Poly(3-hexylthiophene):F4TCNQ |
| (m-MTDATA):F4TCNQ | 4,4',4''-Tris(N-3-methylphenyl-N-phenylamino)triphenylamine:F4TCNQ |

TABLE (10)

Electron balance materials for CBL

| Synonym | Name |
|---|---|
| (BPhen):Cs | Bathophenanthroline:Cs |
| Cs2CO3:Bphen | Cs2CO3:Bathophenanthroline |
| (TPBi):Cs2CO3 | 2,2',2''-(1,3,5-Benzinetriyl)-tris(1-phenyl-1-H-benzimidazole):Cs2CO3 |

Sixth Embodiment

Figure 15:
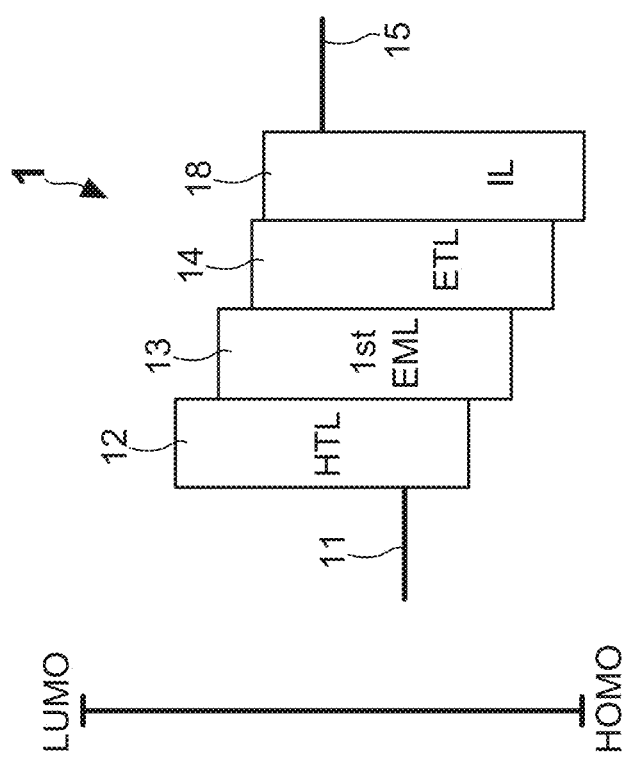
FIG. 15 shows an energy band diagram of a sixth embodiment of the high-efficiency OLED device.

FIG. 15 shows an energy band diagram of a sixth embodiment of the high-efficiency OLED device. After comparing FIG. 15 with FIG. 5, it is easy to know that the sixth embodiment of the high-efficiency OLED device 1 is obtained by adding an interfacial layer (IL) 18 into the structure of the first embodiment. As FIG. 15 shows, the IL 18 is formed between the ETL 14 and the cathode layer 15, and used for enhancing a voltage drop across the ETL 14 when the high-efficiency OLED device 1 is applied with a bias voltage. Conventionally-used manufacturing materials for the IL 18 are listed in following Table (11).

TABLE (11)

Manufacturing materials for IL

| Synonym | Name |
|---|---|
| B3PyPB | 1,3-bis(3,5-dipyrid-3-ylphenyl)benzene |
| TmPyPB | 1,3,5-Tri(m-pyridin-3-ylphenyl)benzene |
| BCP | 2,9-dimethyl-4,7 diphenyl-1,10-phenanthroline |

Therefore, through above descriptions, all embodiments for the high-efficiency OLED device proposed by the present invention have been introduced completely and clearly; in summary, the present invention includes the advantages of:

(1) The present invention provides a high-efficiency OLED device 1, comprising: an anode substrate 11, a HTL 12, at least one EML 13, a ELT 14, and a cathode layer 15. In this high-efficiency OLED 1, LUMO level of the HTL 12, LUMO level of the EML 13 and LUMO level of the ETL 14 together form a step-like LUMO level, and HOMO level of the HTL 12, HOMO level of the EML 13 and HOMO level of the ETL 14 also constitute one step-like HOMO level. On the other hand, the electron mobility of the ETL 14 is greater than the electron mobility of the EML 13 by at least 2 orders in this high-efficiency OLED 1. Moreover, a variety of experimental data have proved that, a specific OLED would certainly exhibits outstanding luminance performance as long as the specific OLED is made based on the above-mentioned physical characteristics limitations for the ETL 14, the EML 13 and the HTL 14.

The above description is made on embodiments of the present invention. However, the embodiments are not intended to limit scope of the present invention, and all equivalent implementations or alterations within the spirit of the present invention still fall within the scope of the present invention.

What is claimed is:

1. A high-efficiency OLED device, comprising:
   an anode substrate;
   a hole transport layer (HTL), being formed on the anode substrate;
   a first emission layer (EML), being formed on the HTL;
   an electron transport layer (ETL), being formed on the EML; and
   a cathode layer, being formed on the ETL;
   wherein the HTL, the first EML and the ETL satisfy following conditions:
   (1) a LUMO level of the first EML being lower than a LUMO level of the HTL, and a HOMO level of the first EML being deeper than a HOMO level of the HTL;
   (2) a LUMO level of the ETL being lower than the LUMO level of the first EML, and a HOMO level of the ETL being deeper than the HOMO level of the first EML; and
   (3) an electron mobility of the ETL being greater than an electron mobility of the first EML.

2. The high-efficiency OLED device of claim 1, further comprising:
   a hole injection layer (HIL), being formed between the anode substrate and the HTL; and
   an electron injection layer (EIL), being formed between the HTL and the cathode layer.

3. The high-efficiency OLED device of claim 1, further comprising a guest dye doped in the first EML.

4. The high-efficiency OLED device of claim 1, further comprising at least one second emission layer (EML) formed between the first EML and the ETL or disposed between the first EML and the HTL.

5. The high-efficiency OLED device of claim 1, further comprising an interfacial layer formed between the ETL and the cathode layer; wherein the interfacial layer is used for enhancing a voltage drop across the ETL when the high-efficiency OLED device is applied with a bias voltage.

6. The high-efficiency OLED device of claim 1, wherein the anode substrate is a transparent conductive substrate.

7. The high-efficiency OLED device of claim 1, wherein a recombination fraction of electrons and holes in the first EML would be greater than 0.6 when the HTL and the first EML satisfy the condition (1) or the first EML and the ETL satisfy the condition (2).

8. The high-efficiency OLED device of claim 1, wherein a recombination fraction of electrons and holes in the first EML would be greater than 0.9 when the HTL, the first EML and the ETL simultaneously satisfy the conditions (1) and (2).

9. The high-efficiency OLED device of claim 1, wherein when the HTL, the first EML and the ETL simultaneously satisfy the conditions (1) and (2), a recombination rate of electrons and holes in the first EML rising with the increasing of the electron mobility of the ETL in the case of fixing an electron mobility of the HTL and the electron mobility of the first EML.

10. The high-efficiency OLED device of claim 4, further comprising a carrier balance layer (CBL) formed between the first EML and the second EML.

11. The high-efficiency OLED device of claim 5, wherein the manufacturing material for the interfacial layer is selected from the group consisting of B3PyPB, TmPyPB and BCP.

12. The high-efficiency OLED device of claim 10, wherein the CBL is made of a specific material selected from the group consisting of hole balance material, electron balance material and combination of the aforesaid two materials.

13. The high-efficiency OLED device of claim 12, wherein the hole balance material is selected from the group consisting of MeO-TPD, F4TCNQ(P3HT):F4TCNQ, and (m-MTDATA):F4TCNQ.

14. The high-efficiency OLED device of claim 12, wherein electron balance material is selected from the group consisting of (BPhen):Cs, $Cs_2CO_3$:BPhen, and (TPBi):$Cs_2CO_3$.

\* \* \* \* \*